United States Patent
De et al.

(10) Patent No.: US 9,407,254 B1
(45) Date of Patent: Aug. 2, 2016

(54) POWER ON-RESET WITH BUILT-IN HYSTERESIS

(71) Applicant: Xilinx, Inc., San Jose, CA (US)

(72) Inventors: Koushik De, Hyderabad (IN); Santosh Yachareni, Hyderabad (IN); Shidong Zhou, Milpitas, CA (US)

(73) Assignee: XILINX, INC., San Jose, CA (US)

( * ) Notice: Subject to any disclaimer, the term of this patent is extended or adjusted under 35 U.S.C. 154(b) by 66 days.

(21) Appl. No.: 14/515,115

(22) Filed: Oct. 15, 2014

(51) Int. Cl.
| | | |
|---|---|---|
| H03L 7/00 | (2006.01) |
| H03K 17/22 | (2006.01) |
| H03K 3/012 | (2006.01) |
| H03K 3/037 | (2006.01) |
| G06F 1/24 | (2006.01) |

(52) U.S. Cl.
CPC .............. *H03K 17/223* (2013.01); *H03K 3/012* (2013.01); *G06F 1/24* (2013.01); *H03K 3/0375* (2013.01); *H03K 17/22* (2013.01)

(58) Field of Classification Search
None
See application file for complete search history.

(56) References Cited

U.S. PATENT DOCUMENTS

| | | | | |
|---|---|---|---|---|
| 5,528,182 | A * | 6/1996 | Yokosawa ............ | H03K 17/223 327/143 |
| 5,831,460 | A | 11/1998 | Zhou | |
| 5,852,376 | A * | 12/1998 | Kraus .................. | H03K 17/223 327/143 |
| 6,097,238 | A | 8/2000 | Zhou | |
| 6,307,420 | B1 | 10/2001 | Zhou | |
| 6,377,090 | B1 * | 4/2002 | Bruno .................. | H03K 17/223 323/313 |
| 6,586,975 | B2 * | 7/2003 | Nagaya ................ | H03K 17/223 327/143 |
| 6,847,240 | B1 * | 1/2005 | Zhou .................... | H03K 17/223 327/143 |
| 7,030,668 | B1 | 4/2006 | Edwards | |
| 7,397,284 | B1 | 7/2008 | Liu | |
| 7,403,051 | B1 | 7/2008 | Lesea | |
| 7,782,702 | B1 | 8/2010 | Edwards et al. | |
| 7,944,769 | B1 | 5/2011 | Lesea | |
| 9,110,486 | B2 * | 8/2015 | Siegel ........................ | G05F 3/30 |
| 9,270,265 | B2 * | 2/2016 | Nakamoto ........... | H03K 17/223 |
| 2004/0066218 | A1 * | 4/2004 | Suzuki ................. | H03K 17/223 327/143 |

OTHER PUBLICATIONS

Specification and drawings for U.S. Appl. No. 14/492,370, filed Sep. 22, 2014, Santurkar et al.

* cited by examiner

*Primary Examiner* — Tuan T Lam

(74) *Attorney, Agent, or Firm* — Kin-Wah Tong; Frederick Hsu

(57) ABSTRACT

A device for controlling a power-on reset signal can include a constant current source, for controlling a reference current that is independent of a supply voltage, and a trip point detector circuit driven by the reference current. The trip point detector circuit detects when the supply voltage of the device exceeds a first trip point voltage, and de-asserts the power-on reset signal when the supply voltage exceeds the first trip point voltage. The first trip point voltage can be controlled by a sum of a threshold voltage of a first n-type metal-oxide-semiconductor transistor, a voltage drop across a first resistor, and a threshold voltage of a first p-type metal-oxide-semiconductor transistor. The device may further include a hysteresis circuit, for detecting when the supply voltage falls below a second trip point voltage and causing the trip point detector circuit to reassert the power-on reset signal.

19 Claims, 4 Drawing Sheets

POWER ON-RESET WITH BUILT-IN HYSTERESIS

TECHNICAL FIELD

The present disclosure relates generally to a power-on-reset circuit, and more particularly to a power-on-reset circuit with self-adjusting trip points.

BACKGROUND

When a device is powered on, memory elements may be in random states, which can cause undesirable effects on the device. Thus, many devices include a power-on reset (POR) circuit for detecting a supply voltage and for asserting a reset signal to place memory elements into a known state. For example, a POR circuit may assert a reset signal with a rising supply voltage and de-assert the reset signal after a first voltage, or trip point is reached. In addition, a POR circuit may re-assert the reset signal when a falling supply voltage reaches a second trip point voltage, either as a result of a transient in the supply voltage or when the device, and hence the supply voltage, is turned off. In many existing designs, the trip points exhibit a wide spread, or variation, across process corners and consume significant power. One type of POR circuit with narrower trip point variation is based upon a band gap reference circuit and a generic comparator. However, this type of design occupies a large chip area and is complex in nature.

SUMMARY

In one example, the present disclosure provides a device for controlling a power-on reset signal. The device can include a constant current source, for controlling a reference current that is independent of a supply voltage, and a trip point detector circuit driven by the reference current. The trip point detector circuit may detect when the supply voltage of the device exceeds a first trip point voltage, and de-asserts the power-on reset signal when the supply voltage exceeds the first trip point voltage. In one example, the first trip point voltage is controlled by a sum of a threshold voltage of a first n-type metal-oxide-semiconductor transistor, a voltage drop across a first resistor, and a threshold voltage of a first p-type metal-oxide-semiconductor transistor, where a current through the first resistor and the first n-type metal-oxide-semiconductor comprises the reference current. In addition, the device may include a hysteresis circuit for detecting when the supply voltage falls below a second trip point voltage and causing the trip point detector circuit to reassert the power-on reset signal when the supply voltage has fallen below the second trip point voltage.

In an exemplary device, the trip point detector circuit may include the first p-type metal-oxide-semiconductor transistor, the first n-type metal-oxide-semiconductor transistor, a second p-type metal-oxide-semiconductor transistor, a second n-type metal-oxide-semiconductor transistor, and an output port coupled between the first p-type metal-oxide-semiconductor transistor and the second n-type metal-oxide-semiconductor transistor, for outputting the power-on reset signal. In such a trip point detector circuit, in one example a source of the first p-type metal-oxide-semiconductor transistor is coupled to the supply voltage, a source of the first n-type metal-oxide-semiconductor transistor is coupled to a ground, and a source of the second p-type metal-oxide-semiconductor transistor is coupled to the supply voltage. In one example, the first resistor is coupled to a drain of the second p-type metal-oxide-semiconductor transistor and to a drain of the first n-type metal-oxide-semiconductor transistor. In addition, a source of the second n-type metal-oxide-semiconductor transistor may be coupled to the ground, and a drain of the first p-type metal-oxide-semiconductor transistor may be coupled to a drain of the second n-type metal-oxide-semiconductor transistor.

In another exemplary device, a gate of the first p-type metal-oxide-semiconductor transistor is controlled by a voltage of a connection point between the drain of the second p-type metal-oxide-semiconductor transistor and the first resistor, and a gate of the first n-type metal-oxide-semiconductor transistor, a gate of the second n-type metal-oxide-semiconductor transistor, and the drain of the first n-type metal-oxide-semiconductor transistor are coupled.

In yet another exemplary device, the hysteresis circuit includes a third n-type metal-oxide-semiconductor transistor. In one example, a source of the third n-type metal-oxide-semiconductor transistor is coupled to the ground, and a gate of the third n-type metal-oxide-semiconductor transistor coupled to an output of a first inverter. In one example, the first inverter is for inverting the power-on reset signal. The hysteresis circuit may also include a fourth n-type metal-oxide-semiconductor transistor. In one example, a drain of the fourth n-type metal-oxide-semiconductor transistor is coupled to the output port. In one example, a source of the fourth n-type metal-oxide-semiconductor transistor is coupled to a drain of the third n-type metal-oxide-semiconductor transistor. In addition, a gate of the fourth n-type metal-oxide-semiconductor transistor may be coupled to the gate of the first n-type metal-oxide-semiconductor transistor, the gate of the second n-type metal-oxide-semiconductor transistor, and the drain of the first n-type metal-oxide-semiconductor transistor.

The hysteresis circuit may further include a number of fingers disposed between the third n-type metal-oxide-semiconductor transistor and the fourth n-type metal-oxide-semiconductor transistor, for controlling a difference between the first trip point voltage and a second trip point voltage of the device. In such a hysteresis circuit, the first trip point voltage may comprise a power-up trip point voltage, and the second trip point voltage may comprise a power-down trip point voltage.

The device may further include a buffer circuit that includes the first inverter and a second inverter, for outputting the power-on reset signal that has been passed through the first inverter.

In one or more of these devices and circuits, one or more of the following may apply. The constant current source may comprise a stable transconductance bias circuit. A magnitude of the reference current may be based upon a resistance of a second resistor of the constant current source. The device may further include a start-up circuit for preventing a metastable state of the constant current source; the first p-type metal-oxide-semiconductor transistor may operate in an off state until the supply voltage exceeds the first trip point voltage. The power-on reset signal may be an active-low signal. The device may be configured to adjust the first trip point voltage in a manner proportional to temperature via a resistance of the first resistor and/or the device may be configured to adjust the first trip point voltage in a manner inversely proportional to a temperature, via the threshold voltage of the first n-type metal-oxide-semiconductor transistor and via the threshold voltage of the first p-type metal-oxide-semiconductor transistor.

In another example, the present disclosure provides a method for controlling a power-on reset signal of a device.

For example, the method can include controlling a reference current that is independent of a supply voltage of the device, detecting, using the reference current, when the supply voltage exceeds a first trip point voltage, and de-asserting the power-on reset signal when the supply voltage exceeds the first trip point voltage. In one example, the first trip point voltage is controlled by a sum of a threshold voltage of a first n-type metal-oxide-semiconductor transistor, a voltage drop across a resistor, and a threshold voltage of a first p-type metal-oxide-semiconductor transistor, where a current through the first resistor and the first n-type metal-oxide-semiconductor transistor comprises the reference current. In addition, the method can further include detecting when the supply voltage falls below a second trip point voltage, and reasserting the power-on reset signal when the supply voltage has fallen below the second trip point voltage.

In various examples, one or more of the following may apply. The first trip point voltage may be adjustable via a resistance of the resistor. The detecting when the supply voltage exceeds the first trip point voltage may use a reference voltage that is based upon the reference current. A difference between the first trip point voltage and the second trip point voltage may be adjustable by selecting a number of fingers disposed between a pair of n-type metal-oxide-semiconductor transistors in a hysteresis circuit. The power-on reset signal may be reasserted via a buffer circuit.

The present disclosure also provides a device for controlling a power-on reset signal that can include a first n-type metal-oxide-semiconductor transistor, a second n-type metal-oxide-semiconductor transistor, a first p-type metal-oxide-semiconductor transistor, a second p-type metal-oxide-semiconductor transistor, and a resistor. The first n-type metal-oxide-semiconductor transistor has a source coupled to a ground, and the second n-type metal-oxide-semiconductor transistor has a source coupled to the ground. In one example, a gate of the first n-type metal-oxide-semiconductor transistor, a drain of the first n-type metal-oxide-semiconductor transistor, and a gate of the second n-type metal-oxide-semiconductor transistor are coupled. The first p-type metal-oxide-semiconductor transistor may have a source coupled to a supply voltage and a drain coupled to a drain of the second n-type metal-oxide-semiconductor transistor. The second p-type metal-oxide-semiconductor transistor may also have a source coupled to the supply voltage. The resistor may be coupled to a drain of the second p-type metal-oxide-semiconductor transistor and to a drain of the first n-type metal-oxide-semiconductor transistor. In one example, a gate of the first p-type metal-oxide-semiconductor transistor is coupled to a connection point between the second p-type metal-oxide-semiconductor transistor and the resistor, and a current through the resistor and the first n-type metal-oxide-semiconductor transistor is independent of the supply voltage. In addition, the device can include an output port coupled between the drain of the first p-type metal-oxide-semiconductor transistor and the drain of the second n-type metal-oxide-semiconductor transistor, for outputting the power-on reset signal.

It should be noted that although the terms, "first," "second," "third," and "fourth," etc., have been used above, the use of these terms are intended as labels only. Thus, the use of a term such as "third" in one example does not necessarily imply that the example must in every case include a "first" and/or a "second" of a similar element. In other words, the use of the terms "first," "second," "third," and "fourth," do not imply a particular number of those elements corresponding to those numerical values.

BRIEF DESCRIPTION OF THE DRAWINGS

Accompanying drawings show exemplary circuits and methods in accordance with one or more aspects of the disclosure; however, the accompanying drawings should not be taken to limit the disclosure to the examples shown, but are for explanation and understanding only.

To facilitate understanding, identical reference numerals have been used, where possible, to designate identical elements that are common to the figures.

DETAILED DESCRIPTION

Figure 1:
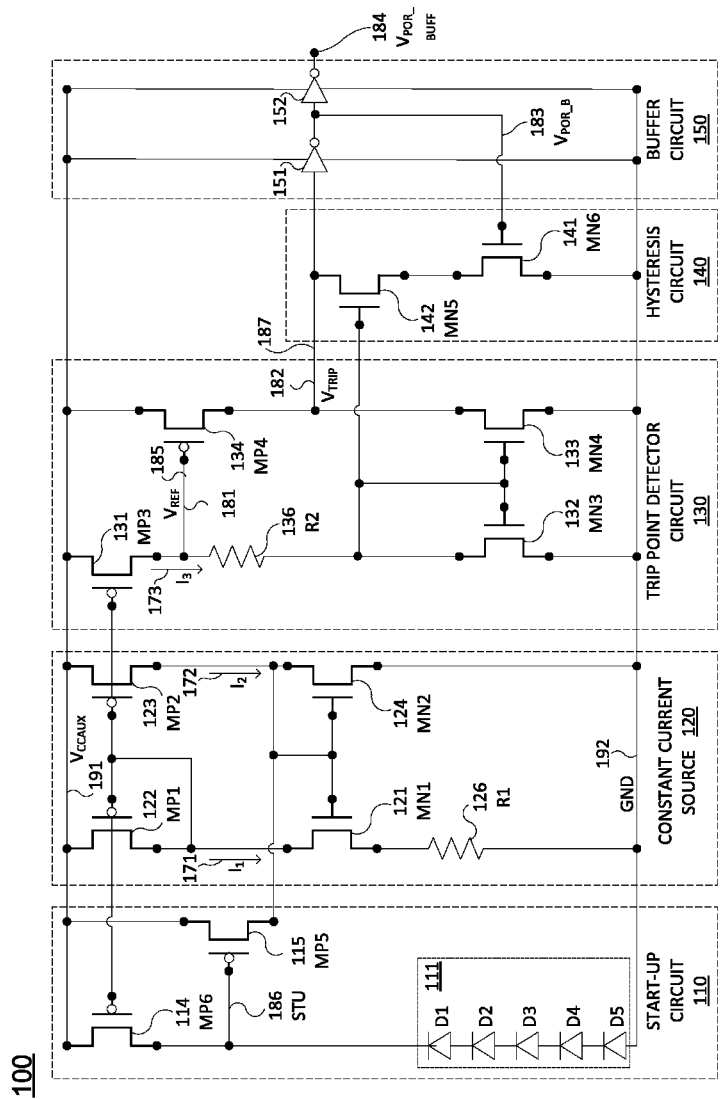
FIG. 1 illustrates a block diagram of an exemplary circuit or device.

The present disclosure describes devices comprising supply monitor circuits with self-adjusting reset thresholds. In one example, a device of the present disclosure uses a constant current source providing a reference current that is constant (e.g., a constant-$G_m$ (stable transconductance) current) to produce reliable and safe supply trip point voltages, which may also be referred to as simply "trip point voltages," for resetting a device. In turn, the reference current is used to generate a reference voltage that is compensated for temperature and supply level variations. In one example, the supply trip point voltages are then detected with respect to the reference voltage that is generated from the reference current and the threshold voltage of a switching p-type metal-oxide-semiconductor (PMOS). For instance, the PMOS may turn on when the supply voltage is greater than the reference voltage by the threshold voltage of the PMOS. In other words, the device may assert a power-on reset signal comprising an active low until a power-up trip point voltage is detected, at which time the output transitions to track the supply voltage, thereby de-asserting the power-on reset signal.

In accordance with the present disclosure, the reference voltage may be generated by dropping the reference current over an n-type metal-oxide-semiconductor (NMOS) and a resistor in series. Thus, the reference voltage may comprise the sum of the threshold voltage of the NMOS and the voltage drop across the resistor. The trip point voltage during a power-up operation may therefore depend upon (1) the sum of the threshold voltage of the NMOS and the voltage across the resistor (where the sum is the reference voltage), plus (2) the threshold voltage of the PMOS. Notably, the sum of the threshold voltage of an NMOS and the threshold voltage of a PMOS may be considered to be the minimum safe operating voltage of a complementary metal oxide semiconductor (CMOS) device. For example, if the threshold voltage of an NMOS is 300 millivolts (mV) and the threshold voltage of a PMOS is 400 mV, then the minimum operating voltage for the CMOS device is at least 700 mV. Accordingly, exemplary devices of the present disclosure may provide an additional safe operating margin above the minimum operating voltage by the selection of a particular resistance for the resistor. In one example, a selection of a resistance for a resistor in a circuit or portion of the device for generating the reference current provides further adjustability for the trip point. A reset signal is asserted until at least the minimum operating voltage is reached, plus some additional voltage offset, which provides a margin for error and greater immunity from supply voltage noise. Thus, the reset signal is de-asserted when a trip point voltage is reached by the supply voltage during power-up (e.g., a "power-up trip point voltage").

In one example, an additional NMOS pull-down is provided in parallel with the main load branch and controlled by a switch, which may comprise still another NMOS, to provide hysteresis. In other words, the device provides a power-up trip point voltage that is different from a power-down trip point voltage to prevent a reset from occurring due to minor variations in the supply operating voltage. Thus, the built-in hysteresis provides robustness against noisy environments that are often found in system-on-chip (SOC) applications. In one example, a device of the present disclosure also includes a start-up circuit to prevent the circuit from entering a meta-stable state.

Examples of the present disclosure may sometimes be referred to herein as SMART (short for, Supply Monitor with self-Adjusting Reset Threshold) circuits, or SMART POR circuits. Notably, exemplary devices of the present disclosure exhibit tighter trip point voltage variation across process corners, occupy a smaller area and consume less power than existing designs. In addition, examples of the present disclosure provide for trip point voltages that are self-adjusting such that the trip point voltages are compensated, i.e., held relatively stable, through temperature and supply voltage level variations. Examples of the present disclosure are also suitable for low supply voltage operation. For instance, examples of the present disclosure may be implemented in a metal-oxide-semiconductor (MOS)-only design, e.g., using 16 nanometer FinFET (a multi-gate field effect transistor with "fin") technology. This is in contrast to existing designs which may utilize a bandgap reference comparator, and which may be implemented using a bipolar junction transistor (BJT)-based circuit.

As mentioned, the trip point voltages are constant regardless of supply voltage and temperature variations. For example, if the supply voltage changes from 1.6 V to 1.9 V, or from 1.5 V to 2.0 V, the trip point voltages remain at the same level(s), irrespective of the supply voltage. In addition, exemplary devices of the present disclosure are also resistant to temperature changes in the range of at least −55 degrees centigrade to 125 degrees centigrade. Nevertheless, the trip point voltages will vary depending upon changes in the process corners. Therefore, if a device is in a fast corner or in a slow corner, the threshold voltages of the NMOS or PMOS may change, which will result in a change in the trip point voltages. However, as compared to existing designs, devices of the present disclosure exhibit substantially tighter (i.e., less) trip point voltage variation through process corners. For instance, trip point voltage variation for designs of the present disclosure may be nearly half that of a conventional power-on reset design.

To aid in understanding the present disclosure, an exemplary device 100 of the present disclosure is depicted in FIG. 1. In particular, device 100 may comprise a circuit, or a portion of an integrated circuit that is designed to provide a POR signal for resetting memory cells (not shown) of the device. In other words, device 100 may comprise part of a larger circuit in a system-on-chip (SOC) design. As illustrated in FIG. 1, device 100 includes five different components, modules, or circuits: 110, 120, 130, 140, and 150. It should be noted that these discrete circuits are shown for ease of understanding only, and do not necessarily comprise constraints or boundaries on the layout or physical implementation of a POR circuit in accordance with the present disclosure. Similarly, the labeling scheme of FIG. 1 does not necessarily imply or require that components be assigned to or be included in the discrete circuits shown in FIG. 1.

Constant current source 120 generates or controls a constant current 171 ($i_1$) or 172 ($i_2$) that is independent of the level of the supply voltage 191 ($V_{ccaux}$). For example, constant current source 120 may comprise a current mirror and provide for currents 171 ($i_1$) and 172 ($i_2$) with constant $G_m$ (stable transconductance). As shown in FIG. 1, constant current source 120 (also referred to as a stable transconductance bias circuit, or constant $G_m$ bias circuit) is illustrated as a four-transistor Wilson current mirror/current source having PMOS 122 (MP1), PMOS 123 (MP2), NMOS 121 (MN1), NMOS 124 (MN2) and resistor 126 (R1). However, in other, further, and different examples, a device of the present disclosure may utilize an alternative constant current source, such as a Wildar current mirror, a cascode current mirror, a modified Wilson, Wildar or cascode current mirror, and so forth. In constant current source 120, the constant currents $i_1$ and $i_2$ may be defined by:

$$i_1 = i_2 = \Delta V_{gs}/R1 = i_{ref} \quad \text{Equation 1:}$$

where $\Delta V_{gs}$ is the difference between the respective gate-source voltages of NMOS 121 (MN1) and NMOS 124 (MN2). Although resistor 126 (R1) can be implemented as a NMOS passive resistor in one embodiment, in another embodiment R1 is implemented as a high resistance (HiR) resistor which can be adjusted using metal options. Either $i_1$ or $i_2$ is used as a reference current, $i_{ref}$, for driving a portion of the trip point detector circuit 130.

The trip point detector circuit 130 comprises the portion of the device 100 that is for detecting when a trip point voltage is reached by the supply voltage 191 ($V_{ccaux}$). As illustrated in the example of FIG. 1, trip point detector circuit 130 includes a first NMOS 132 (MN3), a resistor 136 (R2), and a first PMOS 134 (MP4). The source of NMOS 132 (MN3) is coupled to ground 192 (GND), and the drain is coupled to the resistor 136 (R2). The drain of NMOS 132 (MN3) is also coupled to its own gate and to the gates of NMOS 133 (MN4) and NMOS 142 (MN5). The source of PMOS 134 (MP4) is coupled to the supply voltage 191 ($V_{ccaux}$), and the drain is coupled to the drain of NMOS 133 (MN4), the drain of NMOS 142 (MN5) and to the input of inverter 151. The gate of PMOS 134 (MP4) is controlled by a reference voltage 181 ($V_{ref}$) from a connection point 185 between the drain of PMOS 131 (MP3) and the resistor 136 (R2). The source of PMOS 131 (MP3) is coupled to the supply voltage 191 ($V_{ccaux}$), and its gate is coupled to the gates of PMOS 114 (MP6), PMOS 122 (MP1) and PMOS 123 (MP2). The drain of PMOS 131 (MP3) is coupled to the resistor 136 (R2) and to the gate of the PMOS 134 (MP4). In one example, a constant reference current 173 ($i_3$, also referred to as $i_{ref}$) is dropped across the resistor 136 (R2), where $i_1 = i_2 = i_3 = i_{ref}$. The reference voltage 181 ($V_{ref}$) appearing at the connection point 185 between the drain of PMOS 131 (MP3) and the resistor 136 (R2) is therefore controlled by the reference current 173 and may be defined by:

$$V_{ref} = (i_{ref} * R2) + V_{THN} \quad \text{Equation 2:}$$

where $V_{THN}$ is the threshold voltage of the NMOS, e.g., NMOS 132 (MN3).

The reference voltage 181 controls the gate of PMOS 134 (MP4) which may be referred to as the "decider" PMOS of device 100. In particular, when the supply voltage 191 ($V_{ccaux}$) is ramping up and exceeds the threshold voltage of PMOS 134 (MP4) plus the reference voltage 181 ($V_{ref}$), PMOS 134 (MP4) closes, i.e., turns on, thereby allowing current to flow from the source to the drain. The drain is coupled to an output point 187, or output port having a voltage $V_{trip}$ 182 which is represented by:

$$V_{trip} = V_{ref} + |V_{THP}|$$ Equation 3:

where $V_{THP}$ is the threshold voltage of the PMOS, e.g., PMOS 134 (MP4). In other words, when the supply voltage 191 ($V_{ccaux}$) exceeds the power-up trip point voltage, the voltage $V_{trip}$ 182 at the output point tracks the supply voltage 191 ($V_{ccaux}$).

However, the power-up trip point voltage, the voltage at which the decider PMOS 134 (MP4) turns on, is independent of the supply voltage 191 ($V_{ccaux}$). This can be demonstrated by replacing $V_{ref}$ in Equation 3 with the expression in Equation 2, giving:

$$V_{trip} = (i_{ref} * R2) + V_{THN} + |V_{THP}|$$ Equation 4:

Thus, the trip point voltage is only dependent upon the NMOS threshold voltage, the PMOS threshold voltage and the first term ($i_{ref}*R2$), which may be labeled $V_{OFFSET}$. Replacing $i_{ref}$ with the expression from Equation 1 also gives:

$$V_{OFFSET} = \Delta V_{gs} * R2/R1$$ Equation 5:

As can be seen, the offset voltage may therefore be selected by choosing R1 and R2, and the ratio between the resistances.

Notably, $V_{trip}$ 182 provides the power-on reset signal 184 for device 100, where the power-on reset signal is asserted as an active low signal and de-asserted as an active high signal. For instance, $V_{trip}$ 182 is an active low signal until the supply voltage 191 ($V_{ccaux}$) exceeds the power-up trip point voltage, at which time it tracks the supply voltage 191 ($V_{ccaux}$) and thus is an active high signal. However, device 100 includes additional circuits, such that $V_{trip}$ 182 is further processed and delayed prior to the power-on reset signal being output from the device 100 as $V_{por\_buff}$ 184 at the output of inverter 152.

As mentioned above, the present disclosure provides devices having trip point voltages that are resistant to temperature variation. This function may be demonstrated by reference to Equations 4 and 5. Specifically, the first offset voltage, $V_{OFFSET} = \Delta V_{gs} * R2/R1$, varies in a manner proportional to absolute temperature (PTAT). For instance, the offset voltage $V_{OFFSET}$ increases when temperature increases in device 100. On the other hand, the threshold voltages of NMOS and PMOS transistors decrease in magnitude with increasing temperature, and increase with a decline in temperature. In other words, the magnitudes of $V_{THN}$ and $V_{THP}$ vary in a manner complementary to absolute temperature (CTAT). Accordingly, the first term ($i_{ref}*R2$) and the last two terms ($V_{THN}+|V_{THP}|$) in Equation 4 can be seen to balance each other out. In other words, with an increase in temperature, the first term increases while the last two terms decrease. Conversely, with a decrease in temperature the first term decreases while the last two terms increase. A selection of the slope factor R2/R1 can therefore balance CTAT and PTAT factors for a flat response across temperature variation.

Trip point detector circuit 130 also includes an additional NMOS 133 (MN4) (which may be considered as a pull-down NMOS) for responding to hysteresis circuit 140 and providing a power-down trip point. The source of NMOS 133 (MN4) is coupled to ground 192. The gate is coupled to the gates of NMOS 132 (MN3) and NMOS 142 (MN5), and to the drain of NMOS 132 (MN3). The drain of NMOS 133 (MN4) is coupled to the drain of PMOS 134 (MP4) and to the input of inverter 151.

Notably, it is also desirable to provide a reset signal to memory elements when an integrated circuit is being powered down. At the same time, device 100 also includes a built-in tolerance for noise and supply glitch. For instance, device 100 will not reset memory elements if there is a slight dip in the supply voltage 191 ($V_{ccaux}$); but if there is a large drop in the supply voltage 191 ($V_{ccaux}$) where reliable operation of the device cannot be guaranteed, then device 100 will re-assert the reset signal.

In the example of FIG. 1, NMOS 141 (MN6) of hysteresis circuit 140 functions as a switch to strengthen and weaken the pull down of NMOS 133 (MN4) using NMOS 142 (MN5). The source of NMOS 141 (MN6) is coupled to ground 192, the drain is coupled to the source of NMOS 142 (MN5) and the gate is coupled to the output of the inverter 151. The source of NMOS 142 (MN5) is coupled to the drain of NMOS 141 (MN6), the drain is coupled to the drain of PMOS 134 (MP4), to the drain of NMOS 133 (MN4) and to the input of inverter 151.

In the present example, device 100 further includes, in one example, a buffer circuit 150 comprising two back-to-back inverters 151, 152. The gate of NMOS 141 (MN6) is controlled by a voltage 183 ($V_{por\_b}$), which comprises the output of (V inverter 151, and which is therefore the inversion of $V_{trip}$ 182. The output of inverter 152, $V_{por\_buff}$ 184 comprises the power-on reset signal that may be provided by device 100 to memory elements (not shown for simplification) of a device. Notably, $V_{por\_buff}$ 184 essentially mirrors $V_{trip}$ 182 from the output point of trip point detector circuit 130, with a small delay due to the buffer circuit 150. Although only two inverters are shown in buffer circuit 150, it should be understood that any number of additional inverters may be included, e.g., to provide further delay.

Returning to a description of the hysteresis circuit 140, initially NMOS 133 (MN4) functions as a strong pull-down until the PMOS 134 (MP4) is turned on. As soon as PMOS 134 (MP4) is turned on and $V_{trip}$ 182 is pulled high, the pull down of NMOS 133 (MN4) is weakened by disabling NMOS 142 (MN5), where NMOS 141 (MN6) is used as a switch. To illustrate, when PMOS 134 (MP4) is off, $V_{trip}$ 182 is zero and the output of the inverter 151, $V_{por\_b}$ 183, is high (tracking $V_{ccaux}$ 191). Accordingly, NMOS 141 (MN6) is turned on; NMOS 142 (MN5) and NMOS 133 (MN4) are also on and the pull-down is strong. As soon as PMOS 134 (MP4) is turned on and $V_{trip}$ 182 goes high (tracking $V_{ccaux}$ 191), the output of the inverter 151, $V_{por\_b}$ 183, goes to zero. The switch, NMOS 141 (MN6), is turned off, which also disables NMOS 142 (MN5). Thus, while NMOS 133 (MN4) remains closed/on, the pull-down becomes weak (as compared to the decider PMOS 134 (MP4)). Accordingly, the power-up trip point voltage is higher than the power-down trip point voltage (i.e., the trip point voltage when the supply voltage 191 is ramping down). In one example, the difference between the power-up trip point voltage and the power-down trip point voltage (the hysteresis) can be controlled by setting the number of fingers disposed between NMOS 141 (MN6) and NMOS 142 (MN5).

In one example, device 100 further includes a startup circuit 110 which prevents the device 100, and constant current source 120 in particular, from entering a meta-stable state. Startup circuit 110 includes a diode chain 111, with one or more diodes. As shown in FIG. 1, there are five diodes (D1-D5). Startup circuit 110 also includes PMOS 114 (MP6) and PMOS 115 (MP5) which are configured and arranged as shown. In particular, the gate of PMOS 114 (MP6) is tied to the gates of PMOS 122 (MP1) and PMOS 123 (MP2) in the constant current source 120, and to the gate of PMOS 131 (MP3) in the trip point detector circuit 130. In addition, the drain of PMOS 115 (MP5) is coupled to the gates of NMOS 121 (MN1) and NMOS 124 (MN2). To illustrate, initially the startup signal 186 (STU) is zero and follows the ground signal 192. When the device is turned on, as soon as the supply voltage 191 ($V_{ccaux}$) exceeds the threshold voltage of PMOS 115 (MP5), the transistor is turned on and a current flows from the drain into constant current source 120. Initially, as the supply voltage 191 ($V_{ccaux}$) is ramping up, PMOS 114 (MP6) is off. The source of PMOS 114 (MP6) tracks the supply voltage 191 ($V_{ccaux}$). The gate of PMOS 114 (MP6) also tracks the supply voltage 191 ($V_{ccaux}$). However, when PMOS 115 (MP5) turns on and current begins to flow in the constant current source 120, the gates of PMOS 122 (MP1) and PMOS 123 (MP2) begin to lose track of the supply voltage 191 ($V_{ccaux}$). When the supply voltage 191 (V 1 reaches or exceeds $V_{THN}+|V_{THP}|$, the constant current source 120 attains the desired operating point. At this stage, all of PMOS 122 (MP1), PMOS 123 (MP2), PMOS 114 (MP6) and PMOS 131 (MP3) are therefore turned on. As such, PMOS 114 (MP6) will turn on only when the supply voltage 191 ($V_{ccaux}$) exceeds $V_{THN}$ by the threshold voltage of PMOS 114 (MP6). When PMOS 114 (MP6) turns on, the startup signal 186 (STU) is made to track the supply voltage 191 ($V_{ccaux}$). This causes PMOS 115 (MP5) to turn off, since its source and gate are both at the same level (i.e., tracking the supply voltage 191 ($V_{ccaux}$)).

It should be noted that startup circuit 110 as illustrated in FIG. 1 is just one example configuration for preventing constant current source 120 from entering a meta-stable state. Accordingly, other, further and different start-up module configurations may be implemented in accordance with the present disclosure without altering or without substantially altering the function of device 100. In addition, as mentioned above, different configurations may also be implemented for the constant current source 120, trip point detector circuit 130, hysteresis circuit 140 and/or buffer circuit 150. Thus, devices, circuits and modules incorporating these and other variations are contemplated within the scope of the present disclosure.

Figure 2:
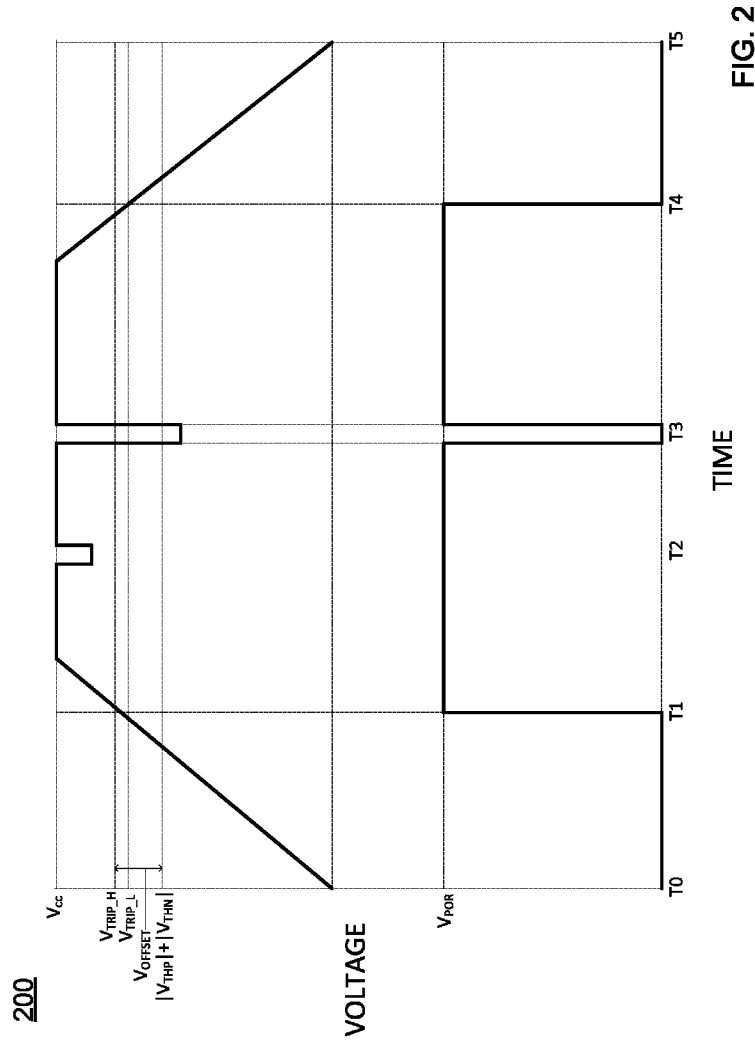
FIG. 2 illustrates a graph of various voltages in a device at various times relevant to a power-on reset process.

To further aid in understanding the present disclosure, FIG. 2 illustrates a graph 200 of voltage versus time for a supply voltage $V_{cc}$ and a power-on reset signal $V_{por}$. In one example, the graph 200 of FIG. 2 may illustrate the function of device 100 as incorporated into an integrated circuit, device, or chip, with respect to several illustrative power-on reset (POR) events. For instance, at time T0 the supply voltage $V_{cc}$ is turned on and begins to ramp up. At the same time, the power-on reset signal $V_{por}$ remains zero (active low). At time T1, the ramping-up supply voltage $V_{cc}$ reaches $V_{TRIP\_H}$, the power-on trip point voltage, which may comprise the sum of $|V_{THP}|+|V_{THN}|+V_{OFFSET}$. This causes power-on reset signal $V_{por}$ to de-assert, i.e., $V_{por}$ goes high along with the supply voltage $V_{cc}$. Notably, as long as the supply voltage $V_{cc}$ does not suffer any substantial noise or other glitch, the power-on reset signal $V_{por}$ will remain high, or de-asserted. For instance, at time T2, the supply voltage $V_{cc}$ exhibits a sudden and temporary drop. However, the supply voltage $V_{cc}$ does not fall below the power-on trip point voltage $V_{TRIP\_H}$. The supply voltage $V_{cc}$ also does not fall below the power-down trip point voltage $V_{TRIP\_L}$, where there is a small differential between $V_{TRIP\_H}$ and $V_{TRIP\_L}$ based upon the implementation of the hysteresis circuit 140. Thus, the power-on reset signal $V_{por}$ will remain high, or de-asserted.

However, at time T3, the supply voltage $V_{cc}$ suffers a sudden drop in voltage and falls below $V_{TRIP\_L}$ (and also falls below $|V_{THP}|+|V_{THN}|$). When the supply voltage $V_{cc}$ approaches the minimum safe operating voltage $|V_{THP}|+|V_{THN}|$, reliable operation of the chip cannot be guaranteed. It is therefore desirable to reset the memory elements of the device. Accordingly, the power-on reset signal $V_{por}$ is reasserted (i.e., active low) in response to the supply voltage $V_{cc}$ falling below the power-down trip point voltage $V_{TRIP\_L}$. This may sometime be referred to as a "brown-out" event. When the supply voltage $V_{cc}$ recovers, the power-on reset signal $V_{por}$ is de-asserted. At time T4, the supply voltage $V_{cc}$ is turned off and ramps down to zero. When the supply voltage $V_{cc}$ crosses the power-off trip point voltage $V_{TRIP\_L}$, the power-on reset signal $V_{por}$ is reasserted until time T5 when the device is completely powered off (the supply voltage $V_{cc}$ is zero).

Figure 3:
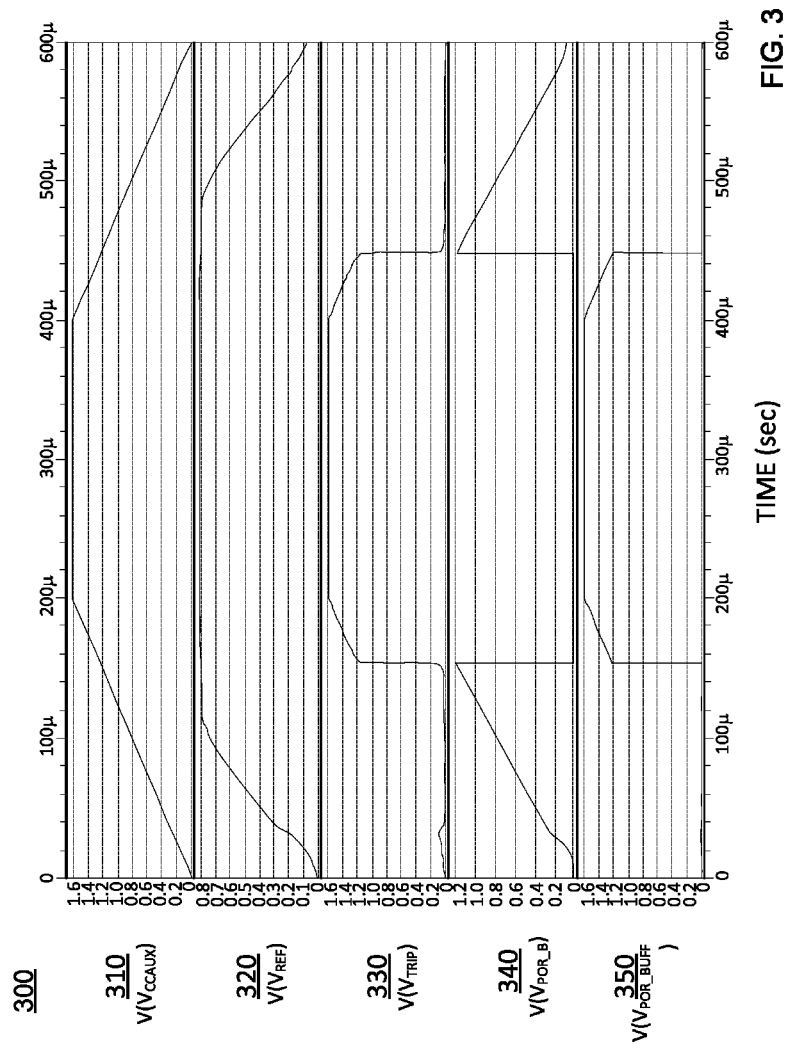
FIG. 3 illustrates an additional graph of various voltages in an exemplary device at various times relevant to a power-on reset process.

FIG. 3 depicts a composite graph 300, which comprises several graphs illustrating voltages/signal values in device 100 at various times in a power-on/power-off cycle. Graph 300 is similar to graph 200, but illustrates several additional internal signal values in addition to the supply voltage and the power-on reset signal output.

The first graph 310 illustrates the supply voltage 191 ($V_{ccaux}$) ramping up from time zero to 200 microseconds (when turned on) and ramping down from time 400 microseconds to 600 microseconds (when turned off). Note that FIG. 3 does not include a brown-out example as in FIG. 2.

The second graph 320 illustrates the response of the reference voltage 181 ($V_{ref}$) when the supply voltage 191 ($V_{ccaux}$) ramps up, holds steady and ramps down.

The third graph 330 illustrates the response of $V_{trip}$ 182 at the output point 187 of the trip point detector circuit 130. Notably, $V_{trip}$ remains low until approximately 150 microseconds, at which time the ramp-up trip point voltage, or trip point voltage, is reached and $V_{trip}$ tracks the supply voltage 191 ($V_{ccaux}$). In this example, it illustrates the operating voltage as 1.6 V while the power-on trip point voltage is illustrated as approximately 1.2 V. Between 400 microseconds and 600 microseconds, the supply voltage 191 ($V_{ccaux}$) is falling to zero. At approximately 450 microseconds, the power-down trip point voltage appears to be reached. Thus, the third graph 330 illustrates $V_{trip}$ falling to zero at approximately 450 microseconds. The power-down trip point voltage also appears to be approximately 1.2 V. However, there is a small differential between the power-on and power-down trip point voltages based upon the implementation of hysteresis circuit 140. For instance, hysteresis circuit 140 may provide a differential of approximately 20-30 mV.

The fourth graph 340 illustrates the response of the output of inverter 151, $V_{por\_b}$ 183. $V_{por\_b}$ 183 is essentially the inverse of $V_{trip}$. However, when $V_{trip}$ is low as the supply voltage 191 ($V_{ccaux}$) is ramping up and ramping down, $V_{por\_b}$ 183 cannot exceed the supply voltage 191 ($V_{ccaux}$). In an alternative example, the present disclosure may utilize $V_{por\_b}$ 183 as a power-on reset signal. In other words, an active-high reset signal may be utilized.

Lastly, the fifth graph 350 illustrates the output of device 100, the power-on reset signal $V_{por\_buff}$ 184. $V_{por\_buff}$ 184 essentially mirrors $V_{trip}$ 182 from the output point of trip point detector circuit 130, but with a small time delay.

Figure 4:
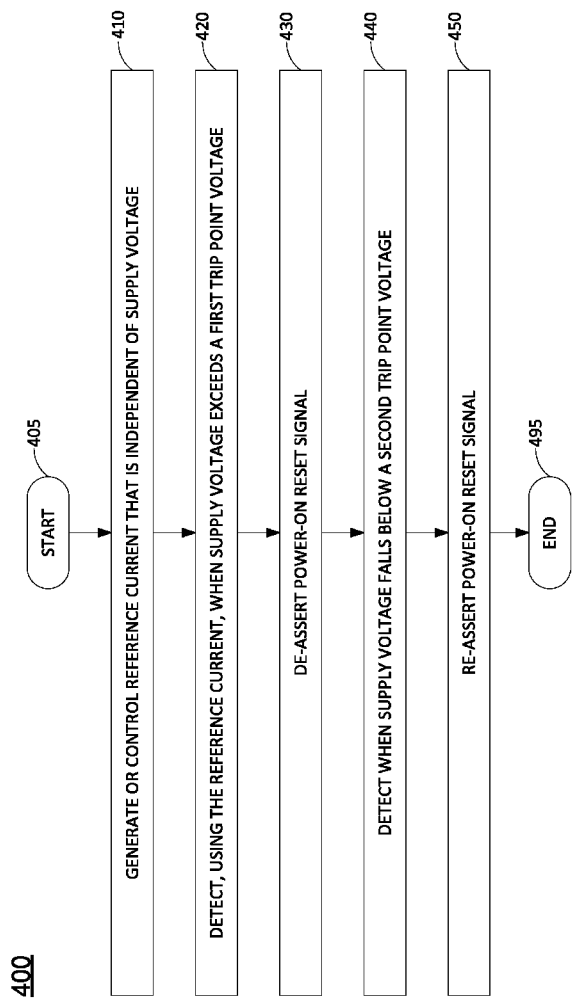
FIG. 4 illustrates a flow diagram of an exemplary method for controlling a power-on reset signal of a device.

To further aid in understanding the present disclosure, FIG. 4 illustrates a flow diagram of an exemplary method 400 for controlling a power-on reset signal for a device. For example, any one or more of the steps, operations or functions of the method 400 may be implemented by a device or circuit, or any one or more components thereof, as described above in connection with FIG. 1. For illustrative purposes, the method 400 is described below as being performed by such a device. The method 400 starts in step 405 and proceeds to step 410.

In step 410, the device generates or controls a reference current that is independent of a supply voltage. For example, step 410 may utilize a constant current source comprising a constant $G_m$ (stable transconductance) reference circuit, or other similar current mirror or constant current source to generate or control a reference current that is independent of the supply voltage of the device. In one example, the constant current source may include a resistor, where the selection of a resistance of the resistor may influence the magnitude of the reference current.

At step 420, the device detects when the supply voltage exceeds a first trip point voltage. For instance, the device may utilize a reference voltage that is based upon the reference current generated at step 410. In one example, the reference voltage comprises the sum of a threshold voltage of an NMOS and a voltage drop across a second resistor when the reference current is dropped across the second resistor. In one example, the first trip point voltage is controlled by the sum of the reference voltage and the magnitude of the threshold voltage of a PMOS, e.g., a "decider" PMOS as in FIG. 1. Accordingly, in one example, the first trip point voltage is adjustable by selecting a resistance of the second resistor. In one example, the first trip point voltage is further adjustable by selecting a resistance of the first resistor, which influences the magnitude of the stable reference current and hence the voltage drop across the second resistor. In one example, the device performs step 420 utilizing a trip point detector circuit 130, e.g., as in FIG. 1.

At step 430, the device de-asserts the power-on reset signal when it is detected that the supply voltage exceeds the first trip point voltage. For example, memory cells of a device may accept an active low reset signal. Thus, the power-on reset signal may be active low until the supply voltage exceeds the first trip point voltage, at which time it is permitted for the device to begin normal operations. In other words, de-asserting the power-on reset signal at step 430 may comprise switching the power-on reset signal to an active high, i.e., tracking the supply voltage.

At step 440, the device detects when the supply voltage falls below a second trip point voltage. For example, the device may implement a second trip point voltage, which is less that the first trip point voltage, for re-asserting the power-on reset signal during power-down and brown-out situations. In one example, the second trip point voltage is determined by a hysteresis circuit 140 of the device. For instance, once it is detected at step 420 that the supply voltage has exceeded the first trip point voltage, a pull-down NMOS may be weakened by the hysteresis circuit 140, which may lower the required supply voltage at which the decider PMOS is turned off. Thus, if the supply voltage falls below this second trip point voltage, e.g., due to a power-down or brown-out event, the decider PMOS may turn off. In one example, the difference between the first trip point voltage and the second trip point voltage is adjustable by selecting a number of fingers (not shown) disposed between a pair of NMOS transistors of the hysteresis circuit 140.

At step 450, the device re-asserts the power-on reset signal when it is detected that the supply voltage has fallen below the second trip point voltage. For example, the decider PMOS may turn off, causing the power-on reset signal to fall to zero volts/active low.

Following step 450, the method 400 proceeds to step 495 where the method 400 ends.

It should be noted that in various examples of the present disclosure, the method 400 may include other, further and different steps than those described above. For example, the method 400 may additionally include selecting the resistances of the first resistor and/or the second resistor to provide a flat response to temperature variation in the device and/or to provide a desired additional safe operating margin above a minimum operating voltage of the device. Similarly, the method 400 may include steps or operations in accordance with the functions of any one or more of the components or circuits of the exemplary devices described herein. For instance, method 400 may include steps directed to any one or more additional functions of a startup circuit, a constant current source, a trip point detector circuit, a hysteresis circuit, a buffer circuit, and so forth.

In addition, although not specifically specified, one or more steps, functions or operations of the method 400 may include a storing, displaying and/or outputting step as required for a particular application. In other words, any data, records, fields, and/or intermediate results discussed in the respective methods can be stored, displayed and/or outputted to another device as required for a particular application. Furthermore, steps or blocks in FIG. 4 that recite a determining operation or involve a decision do not necessarily require that both branches of the determining operation be practiced. In other words, one of the branches of the determining operation can be deemed as an optional step.

While the foregoing describes various examples in accordance with one or more aspects of the present disclosure, other and further embodiment(s) in accordance with the one or more aspects of the present disclosure may be devised without departing from the scope thereof, which is determined by the claim(s) that follow and equivalents thereof. Claim(s) listing steps do not imply any order of the steps. Trademarks are the property of their respective owners.

What is claimed is:

1. A device for controlling a power-on reset signal, comprising:
   a constant current source for controlling a reference current that is independent of a supply voltage of the device;
   a trip point detector circuit driven by the reference current, for detecting when the supply voltage of the device exceeds a first trip point voltage and for de-asserting the power-on reset signal when the supply voltage exceeds the first trip point voltage;
   wherein the first trip point voltage is controlled by a sum of a threshold voltage of a first n-type metal-oxide-semiconductor transistor, a voltage drop across a first resistor, and a threshold voltage of a first p-type metal-oxide-semiconductor transistor;
   wherein a current through the first resistor and the first n-type metal-oxide-semiconductor transistor comprises the reference current; and
   a hysteresis circuit for detecting when the supply voltage falls below a second trip point voltage and for causing the trip point detector circuit to reassert the power-on reset signal when the supply voltage has fallen below the second trip point voltage.

2. The device of claim 1, wherein the trip point detector circuit comprises:
   the first p-type metal-oxide-semiconductor transistor, wherein a source of the first p-type metal-oxide-semiconductor transistor is coupled to the supply voltage;
   the first n-type metal-oxide-semiconductor transistor, wherein a source of the first n-type metal-oxide-semiconductor transistor is coupled to a ground;
   a second p-type metal-oxide-semiconductor transistor, wherein a source of the second p-type metal-oxide-semiconductor transistor is coupled to the supply voltage;
   wherein the first resistor is coupled to a drain of the second p-type metal-oxide-semiconductor transistor and to a drain of the first n-type metal-oxide-semiconductor transistor;

a second n-type metal-oxide-semiconductor transistor, wherein a source of the second n-type metal-oxide-semiconductor transistor is coupled to the ground, and a drain of the first p-type metal-oxide-semiconductor transistor is coupled to a drain of the second n-type metal-oxide-semiconductor transistor; and an output port coupled between the first p-type metal-oxide-semiconductor transistor and the second n-type metal-oxide-semiconductor transistor, for outputting the power-on reset signal.

3. The device of claim 2, wherein:

a gate of the first p-type metal-oxide-semiconductor transistor is controlled by a voltage of a connection point between the drain of the second p-type metal-oxide-semiconductor transistor and the first resistor; and a gate of the first n-type metal-oxide-semiconductor transistor, a gate of the second n-type metal-oxide-semiconductor transistor, and the drain of the first n-type metal-oxide-semiconductor transistor are coupled.

4. The device of claim 1, wherein the hysteresis circuit comprises:

a third n-type metal-oxide-semiconductor transistor, wherein a source of the third n-type metal-oxide-semiconductor transistor is coupled to the ground and a gate of the third n-type metal-oxide-semiconductor transistor is coupled to an output of a first inverter;

wherein the first inverter is for inverting the power-on reset signal; and a fourth n-type metal-oxide-semiconductor transistor, wherein:

a drain of the fourth n-type metal-oxide-semiconductor transistor is coupled to the output port, a source of the fourth n-type metal-oxide-semiconductor transistor is coupled to a drain of the third n-type metal-oxide-semiconductor transistor, and a gate of the fourth n-type metal-oxide-semiconductor transistor is coupled to the gate of the first n-type metal-oxide-semiconductor transistor, the gate of the second n-type metal-oxide-semiconductor transistor, and the drain of the first n-type metal-oxide-semiconductor transistor.

5. The device of claim 4, wherein the hysteresis circuit further comprises a number of fingers disposed between the third n-type metal-oxide-semiconductor transistor and the fourth n-type metal-oxide-semiconductor transistor, for controlling a difference between the first trip point voltage and a second trip point voltage of the device.

6. The device of claim 5, wherein:

the first trip point voltage comprises a power-up trip point voltage; and the second trip point voltage comprises a power-down trip point voltage.

7. The device of claim 4, further comprising a buffer circuit, wherein the buffer circuit comprises:

the first inverter; and a second inverter, for outputting the power-on reset signal that has been passed through the first inverter.

8. The device of claim 1, wherein the constant current source comprises a stable transconductance bias circuit.

9. The device of claim 1, wherein a magnitude of the reference current is based upon a resistance of a second resistor of the constant current source.

10. The device of claim 1, further comprising a start-up circuit for preventing a metastable state of the constant current source.

11. The device of claim 1, wherein the first p-type metal-oxide-semiconductor transistor operates in an off state until the supply voltage exceeds the first trip point voltage.

12. The device of claim 1, wherein the power-on reset signal comprises an active-low signal.

13. The device of claim 1, wherein the device is configured to adjust the first trip point voltage in a manner proportional to a temperature via a resistance of the first resistor.

14. The device of claim 1, wherein the device is configured to adjust the first trip point voltage in a manner inversely proportional to a temperature, via the threshold voltage of the first n-type metal-oxide-semiconductor transistor and via the threshold voltage of the first p-type metal-oxide-semiconductor transistor.

15. A method for controlling a power-on reset signal of a device, the method comprising:

controlling a reference current that is independent of a supply voltage of the device;

detecting, using the reference current, when the supply voltage exceeds a first trip point voltage;

de-asserting the power-on reset signal when the supply voltage exceeds the first trip point voltage:

wherein the first trip point voltage is controlled by a sum of a threshold voltage of a first n-type metal-oxide-semiconductor transistor, a voltage drop across a resistor, and a threshold voltage of a first p-type metal-oxide-semiconductor transistor;

wherein a current through the resistor and the first n-type metal-oxide-semiconductor transistor comprises the reference current;

detecting when the supply voltage falls below a second trip point voltage; and reasserting the power-on reset signal when the supply voltage has fallen below the second trip point voltage.

16. The method of claim 15, wherein the first trip point voltage is adjustable via a resistance of the resistor.

17. The method of claim 15, wherein the detecting when the supply voltage exceeds the first trip point voltage uses a reference voltage that is based upon the reference current.

18. The method of claim 15, wherein a difference between the first trip point voltage and the second trip point voltage is adjustable by selecting a number of fingers disposed between a pair of n-type metal-oxide-semiconductor transistors in a hysteresis circuit.

19. The method of claim 15, wherein the power-on reset signal is reasserted via a buffer circuit.

* * * * *